US007768783B1

(12) United States Patent
Kajiya et al.

(10) Patent No.: US 7,768,783 B1
(45) Date of Patent: Aug. 3, 2010

(54) ELECTRONIC MODULE COOLING

(75) Inventors: James T. Kajiya, Duvall, WA (US); J. Turner Whitted, Carnation, WA (US); David W. Williams, Woodinville, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 12/485,544

(22) Filed: Jun. 16, 2009

(51) Int. Cl.
 *H05K 7/20* (2006.01)
(52) U.S. Cl. .................. 361/700; 361/699; 361/715; 361/716; 361/719; 361/721; 257/715; 174/15.2; 165/80.4; 165/104.26
(58) Field of Classification Search ................. None
 See application file for complete search history.

(56) References Cited

U.S. PATENT DOCUMENTS

| | | | |
|---|---|---|---|
| 6,055,157 A | 4/2000 | Bartilson | |
| 6,173,759 B1 | 1/2001 | Galyon et al. | |
| 6,385,044 B1 | 5/2002 | Colbert et al. | |
| 6,466,441 B1 * | 10/2002 | Suzuki | 361/695 |
| 6,542,359 B2 * | 4/2003 | Babcock et al. | 361/679.46 |
| 6,661,664 B2 * | 12/2003 | Sarno et al. | 361/719 |
| 6,903,931 B2 * | 6/2005 | McCordic et al. | 361/711 |
| 7,304,842 B2 | 12/2007 | Yatskov | |
| 7,450,378 B2 * | 11/2008 | Nelson et al. | 361/689 |
| 7,694,725 B2 * | 4/2010 | Chang | 165/104.21 |
| 2008/0285234 A1 | 11/2008 | Cheng et al. | |
| 2008/0291630 A1 | 11/2008 | Monh et al. | |

OTHER PUBLICATIONS

"Memory Module Cooler Uses Integrated Heat Pipe", retrieved May 13, 2009 at http://news.thomasnet.com/fullstory/540412, Feb. 22, 2008, 3 pgs.
"Nexus TDD-2000 Therma Innovation Heat-Pipe Technology Laptop/Notebook Cooler (Cooling Pad): Quiet, Noiseless (Retail)" retrieved May 13, 2009 at ttp://www.xpcgear.com/notebookcooler.html, 2 pgs.
"What is a Heat Pipe?" retrieved May 13, 2009 at http://www.cheresources.com/htpipes.shtml, 10 pgs.

* cited by examiner

*Primary Examiner*—Boris L Chervinsky
(74) *Attorney, Agent, or Firm*—Lee & Hayes, PLLC (57) ABSTRACT

Embodiments for cooling electronic modules are disclosed. In accordance with at least one embodiment, an electronic module is inserted into a cooling sled that is equipped with a bay. The bay of the cooling sled is equipped with a pair of sides to retain the electronic module. The electronic module contains a working fluid that is sealed inside the module with one or more electronic components. During the operation of the electronic module, the working fluid is vaporized by the heat generated by the one or more electronic components. The electronic module is then cooled via the cooling sled. The cooling of the electronic module condenses the working fluid that is vaporized by the heat generated by the one or more electronic components. The condensed cooling fluid is then returned to the one or more electronic components via a wick structure that is also sealed in the electronic module.

20 Claims, 8 Drawing Sheets

ELECTRONIC MODULE COOLING

BACKGROUND

Electronic components generate waste heat during operation. In performance-intensive computing devices, the ability to conduct away such waste heat is essential for proper operation and optimal performance of computing devices. Moreover, the effective conduction of waste heat away from electronic components in computing devices may enable the encapsulation of greater computing power in more compact hardware packages.

SUMMARY

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

Described herein are embodiments of various techniques for the individualized cooling of electronic modules, which may be individually packaged units of computing components that make up a computing device. The ability to effectively cool, that is, conduct waste heat away from such electronic modules during their operation may help to ensure the proper operation and optimal performance of the electronic modules. Moreover, techniques for cooling such electronic modules on an individual basis, rather than the collective cooling of a single computing device, may enable the electronic modules to be swapped or reconfigured in various combinations without the redesign of a central cooling scheme, the adjustment and redistribution of cooling resources, and/or additions to a cooling infrastructure.

In at least one embodiment, an electronic module is inserted into a cooling sled that is equipped with a bay. The bay of the cooling sled is equipped with a pair of sides to retain the electronic module. The electronic module contains a working fluid that is sealed inside the module with one or more electronic components. During the operation of the electronic module, the working fluid is vaporized by the heat generated by the one or more electronic components. The electronic module is then cooled via the cooling sled. The cooling of the electronic module condenses the working fluid that is vaporized by the heat generated by the one or more electronic components. The condensed cooling fluid is then returned to the one or more electronic components via a wick structure that is also sealed in the electronic module. Other embodiments will become more apparent from the following detailed description when taken in conjunction with the accompanying drawings.

BRIEF DESCRIPTION OF THE DRAWINGS

The detailed description is described with reference to the accompanying figures. In the figures, the left-most digit(s) of a reference number identifies the figure in which the reference number first appears. The use of the same reference number in different figures indicates similar or identical items.

DETAILED DESCRIPTION

This disclosure is directed to cooling techniques for electronic modules that contain one or more electronic components. In some embodiments, the electronic modules may be a collection of self-contained units of computing components that may be coupled together to form a computing device. For example, but not as a limitation, the electronic modules may include a central processing unit (CPU), a memory module, a video module, a sound module, and/or an interface module for a computing device. In other embodiments, each of the electronic modules may be a single computing device (e.g., a server, a small form factor computer, an embedded computer) that is capable of providing output data based on received input data.

Furthermore, the electronic modules may include built-in cooling components that interact with an external cooling sled to enable the electronic modules to transfer the heat generated during their operation to a cooling source (e.g., heat sink, ambient air). Accordingly, the various embodiment described herein may ensure the optimal performance of the electronic modules. Additionally, the cooling of the electronic modules in accordance with various embodiments may enable the electronic modules to be packed tightly together to achieve greater computing density.

Various examples of electronic module cooling techniques in accordance with the embodiments are described below with reference to FIGS. 1-8.

Exemplary Electronic Modules

Figure 1:
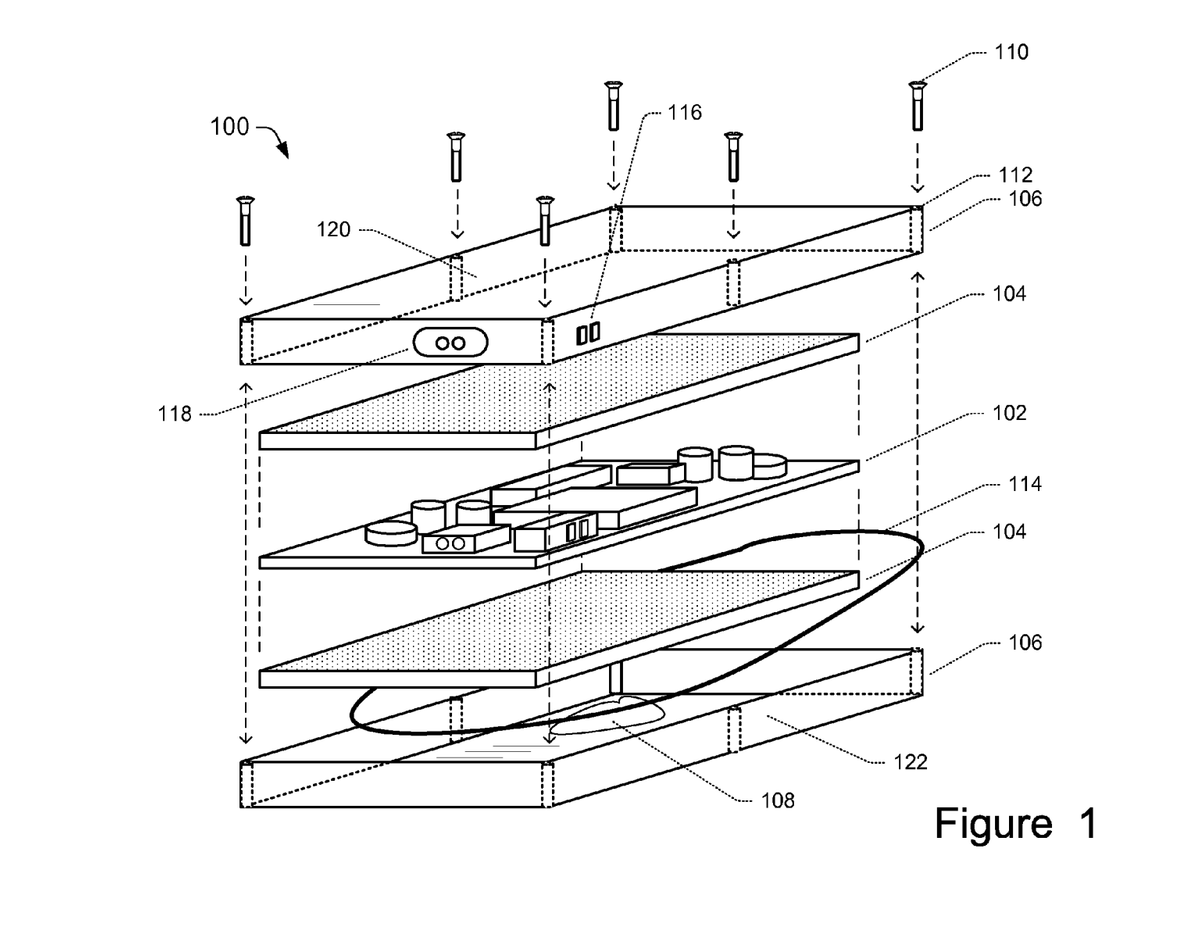
FIG. 1 shows an exploded view that illustrates the exemplary components of a first electronic module that is equipped with integrated cooling capability, in accordance with various embodiments of electronic module cooling.

FIG. 1 shows an exploded view that illustrates the exemplary components of an electronic module 100 that is equipped with integrated cooling capability, in accordance with various embodiments. The electronic module 100 includes a circuit board 102 that is surrounded by a wick structure 104. The circuit board and the wick structure 104 may be retained inside an enclosure 106.

The circuit board 102 may be a printed circuit board (PCB) that includes one or more surface mounted electronic components that facilitate the performance of computing operations. For example, but not as a limitation, the electronic components may include a processor chip, a memory chip, an input/output (I/O) chip, a BIOS chip, a controller chip, and/or other chips that include integrated circuits in various combinations. In at least one embodiment, circuit board 102 may be manufactured using chip-on-board technology, so that the die of each chip is exposed, i.e., without being covered in a casing. Moreover, the one or more electronic components on the circuit board may maintain low-profile discipline to minimize height disparity between the various electronic components.

Further, in some embodiments, the electronic components may also include peripheral circuit components, such as capacitors, resistors, diodes, transistors, etc. The one or more electronic components of the circuit board 102 may generate waste heat during the operation of the electronic module 100.

The wick structure 104 may retain and interact with a working fluid 108. In at least one embodiment, the wick structure 104 may be a flexible foam wicking material. During the operation of the electronic module 100, the waste heat generated by the one or more electronic components of the circuit board 102 may vaporize the working fluid 108. The working fluid 108 may then be cooled as it condenses against the enclosure 106. Further, the wick structure 104 may conduct the condensed working fluid 108 back to the circuit board 102 via capillary action so that the working fluid 108 may repeat the vaporization.

As shown in FIG. 1, the wick structure 104 may include several wicking portions that are stacked adjacent the circuit board 102. Thus, the portions of the wick structure 104 may contact the circuit board 102 when the circuit board 102 and the wick structure 104 are retained inside the enclosure 106. In some embodiments, one or more portions of the wick structure 104 may include slots or indentations to accommodate the electronic components on the circuit board 102. In this way, contact between the electronic components on the circuit board 102 and the wick structure 104 may be achieved despite differences in size, shape, and/or height of the electronic components. However, in other embodiments, the wick structure 104 may be wrapped around the circuit board 102, in which instance, contact between wick structure 104 and the one or more electronic components on the circuit board 102 may be achieved by the flexibility of the wick structure 104. In yet other embodiments, the wick structure 104 may be positioned so it is adjacent to only one side of the circuit board 102. For example, but not as a limitation, the wick structure 104 may be positioned on the side of the circuit board 102 where the one or more electronic components may be mounted in place, as the one or more electronic components are responsible for generating the majority of the waste heat.

The working fluid 108 is a coolant that may be vaporized by the waste heat generated by the one or more electronic components of the circuit board 102. In various embodiments, the working fluid 108 may include ethanol, fluorocarbon, or other types of dielectric fluid. The material of the wick structure 104 may have favorable wetting characteristics with respect to the working fluid 108.

The enclosure 106 may serve to isolate the circuit board 102, the wick structure 104, and the working fluid 108 from the outside environment. In various embodiments, the enclosure 106 may be manufactured from a metallic material. In at least one embodiment, the enclosure 106 may be manufactured from aluminum nitride. It will be appreciated that aluminum nitride is a more favorable enclosure material than anodized aluminum, as the thermal conductance of aluminum nitride is generally three orders of magnitude above anodized aluminum. Nitride aluminum also has tribology and wear advantages over anodized aluminum.

The enclosure 106 may be manufactured as separate mating portions to facilitate the installation of the circuit board 102, the wick structure 104, and the working fluid 108 inside the enclosure. As shown in FIG. 1, the enclosure 106 may be manufactured as two half portions having identical, or substantially identical dimensions. However, in other embodiments, the enclosure 106 may include portions having unequal dimensions, provided that the circuit board 102, the wick structure 104, and the working fluid 108 may be properly fitted inside the enclosure 106. For example, but not as limitation, the enclosure 106 may include a "body" portion and a "lid" portion, in which the external surface area of the "body" portion is larger than the external surface area of the "lid" portion.

In some embodiments, the portions of the enclosure 106 may be joined together and secured via one or more fasteners 110 (e.g., screws) and corresponding fastener retaining recesses 112 (e.g., screw holes) that are present in the portions. In some embodiments, an elastic sealing member 114 (e.g., rubber gasket), may be positioned between the portions. The elastic sealing member 114 may serve to ensure an airtight seal between the portions of the enclosure 106 following assembly, and during operation, of the circuit board 102. However, it will be appreciated that other joining techniques may be utilized to ensure an airtight seal between the portions of the enclosure 106. Such techniques may include, but are not limited to, the use of welding, soldering, and/or adhesives. In at least one embodiment, the enclosure 106 may be at least partially evacuated so that the working fluid 108 may vaporize at a pre-designated temperature to effectively convey the waste heat away from the one or more electronic components of the circuit board 102. In this way, the overheating of the electronic components may be prevented.

The enclosure 106 may further include an integrated power connector 116 that passes power (e.g., alternating current or direct current) from the outside of the enclosure 106 to the circuit board 102 inside the enclosure 106. In various embodiments, the power connector 116 may enable the pass through of power to the circuit board 102 while retaining the airtight integrity of the enclosure. In at least one embodiment, the external part of the power connector 116 may include one or more resilient (e.g., spring-loaded) conductors. Additionally, the interior of the power connector 116 may include conductors that couple with corresponding power conductors on the circuit board 102 (e.g., plug and socket type power connectors).

The enclosure 106 may additionally include an integrated data connector 118 that facilitates data input/output between the one or more electronic components of the electronic module 100 and other electronic components that are outside of the enclosure 106. In various embodiments, the data connector 118 may enable at least one electronic component of the circuit board 102 to exchange data with an electronic component that is outside of the enclosure 106. In at least one embodiment, the exterior of the data connector 118 may include one or more resilient (e.g., spring-loaded) leads. Additionally, the interior of the data connector 118 may include leads that couple with corresponding data leads for at least one electronic component of the circuit board 102 (e.g., plug and socket type data connectors). In further embodiments, the enclosure 106 may include combined power connector 116 and data connector 118. In other words, the conductors that penetrate the enclosure 106 without compromising the airtight integrity of the enclosure may provide both power input and data connectivity to the one or more electronic components of the circuit board 102.

In still other embodiments, the integrated data connector 118 may be a transparent or substantially transparent optical window or an optical connector. In such embodiments, the integrated data connector 118 may enable at least one electronic component on the circuit board 102 to communicate with an electronic component on the outside of the enclosure 106 via optical signals (e.g., fiber optics).

The enclosure 106 may include at least two planar heat conduction sides 120 and 122. The two planar heat conduction sides 120 and 122 may absorb the waste heat retained by the vaporized working fluid 108 so that the working fluid 108 may condense into a liquid. As further described below, the at least two planar heat conduction sides 120 and 122 may be further configured to contact heat sinks along their external planar surfaces so that the waste heat may be transferred to an ambient environment. In various embodiments, each of the aluminum nitride surfaces of the sides 120 and 122 may be a smooth plane to maximize contact with the heat sinks.

Figure 2:
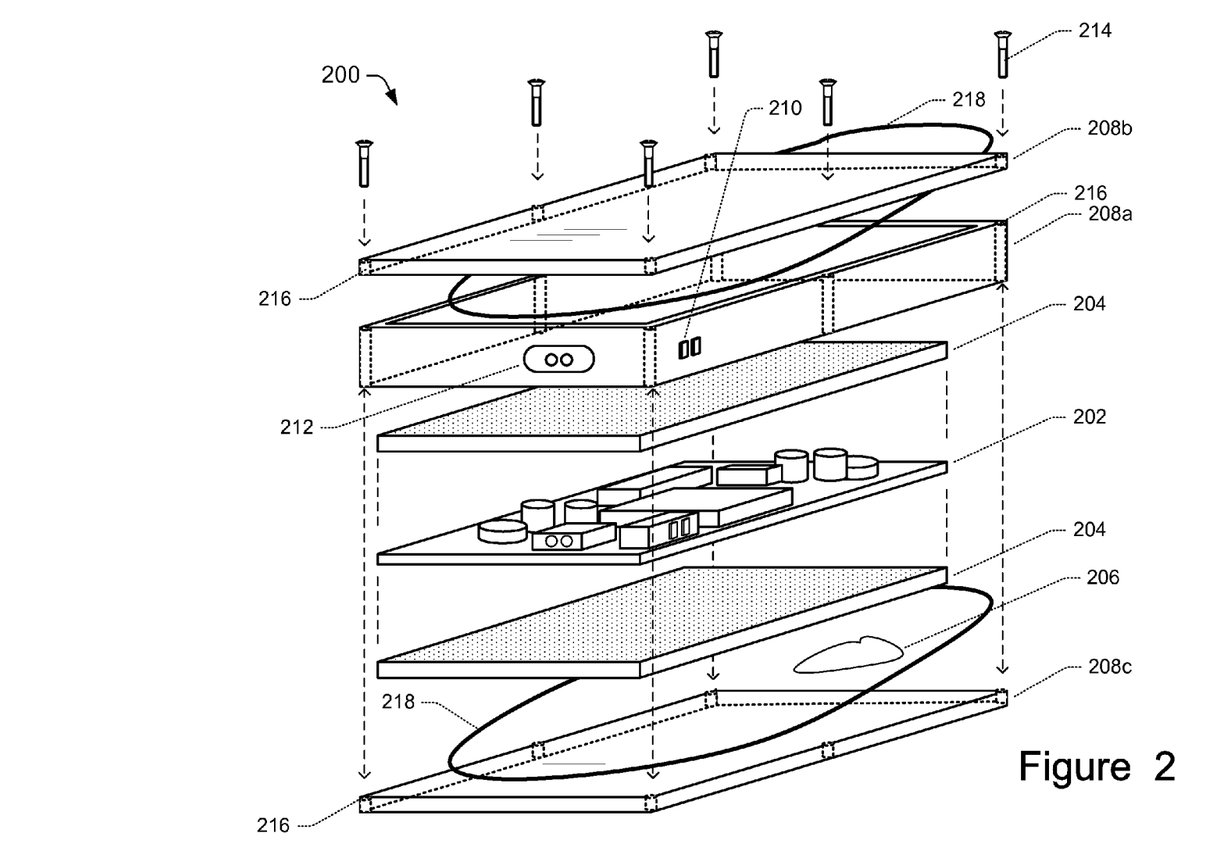
FIG. 2 shows an exploded view that illustrates the exemplary components of a second electronic module that is equipped with integrated cooling capability, in accordance with various embodiments of electronic module cooling.

FIG. 2 shows an exploded view that illustrates the exemplary components of an electronic module 200 that is equipped with integrated cooling capability, in accordance with various embodiments. The electronic module 200 includes a circuit board 202, a wick structure 204, and a working fluid 206 that are similar to their counterparts as described in FIG. 1.

The circuit board 202, the wick structure 204, and the working fluid 206 may be retained inside an enclosure 208. The enclosure 208 may include a body portion 208a and two end portions 208b and 208c. In various embodiments, the body portion 208a may be manufactured from extruded polymer (e.g., polycarbonate or other plastic material). In at least one embodiment, the body portion 208a may be translucent so that status indicator lights on at least one electronic component of the circuit board 202 may be visible. The body 208a may further include an integrated power connector 210 and an integrated data connector 212 that are similar to their counterparts described in FIG. 1.

The body portion 208a may be mated with the two end portions 208b and 208c to produce the airtight enclosure 208. Each of the two end portions 208b and 208c may be a planar heat conduction panel that is manufactured from a metallic material. In at least one embodiment, each of the two end portions 208b and 208c may be manufactured from aluminum nitride, in the same fashion as described with respect to the enclosure 106 of FIG. 1.

The end portions 208b and 208c may be joined with the body portion 208a via one or more fasteners 214 (e.g., screws) and corresponding fastener retaining recesses 216 (e.g., screw holes) that are present in the body portion 208a and the end portions 208b and 208c. In some embodiments, an elastic sealing member 218 (e.g., rubber gasket), may be positioned between each end portion 208b and 208c and the body portion 208a. The elastic sealing member 218 may serve to ensure an airtight seal between all portions of the enclosure 208 following assembly and during operation of the electronic module 200.

However, it will be appreciated that other joining techniques may be utilized to ensure an airtight mating between the portions of the enclosure 208. Such techniques may include, but are not limited to, the use of welding, soldering, and/or adhesives. In at least one embodiment, the enclosure 208 may be at least partially evacuated so that the working fluid 206 may be vaporized at a pre-designated temperature that effectively conveys the waste heat away from the one or more electronic components of the circuit board 202 to prevent overheating of the components.

As further described below, the end portions 208b and 208c may be positioned to contact heat sinks along their external planar surfaces so that the waste heat generated by the one or more electronic components of the circuit board 202 may be transferred to an ambient environment.

Exemplary Module Sled

Figure 3:
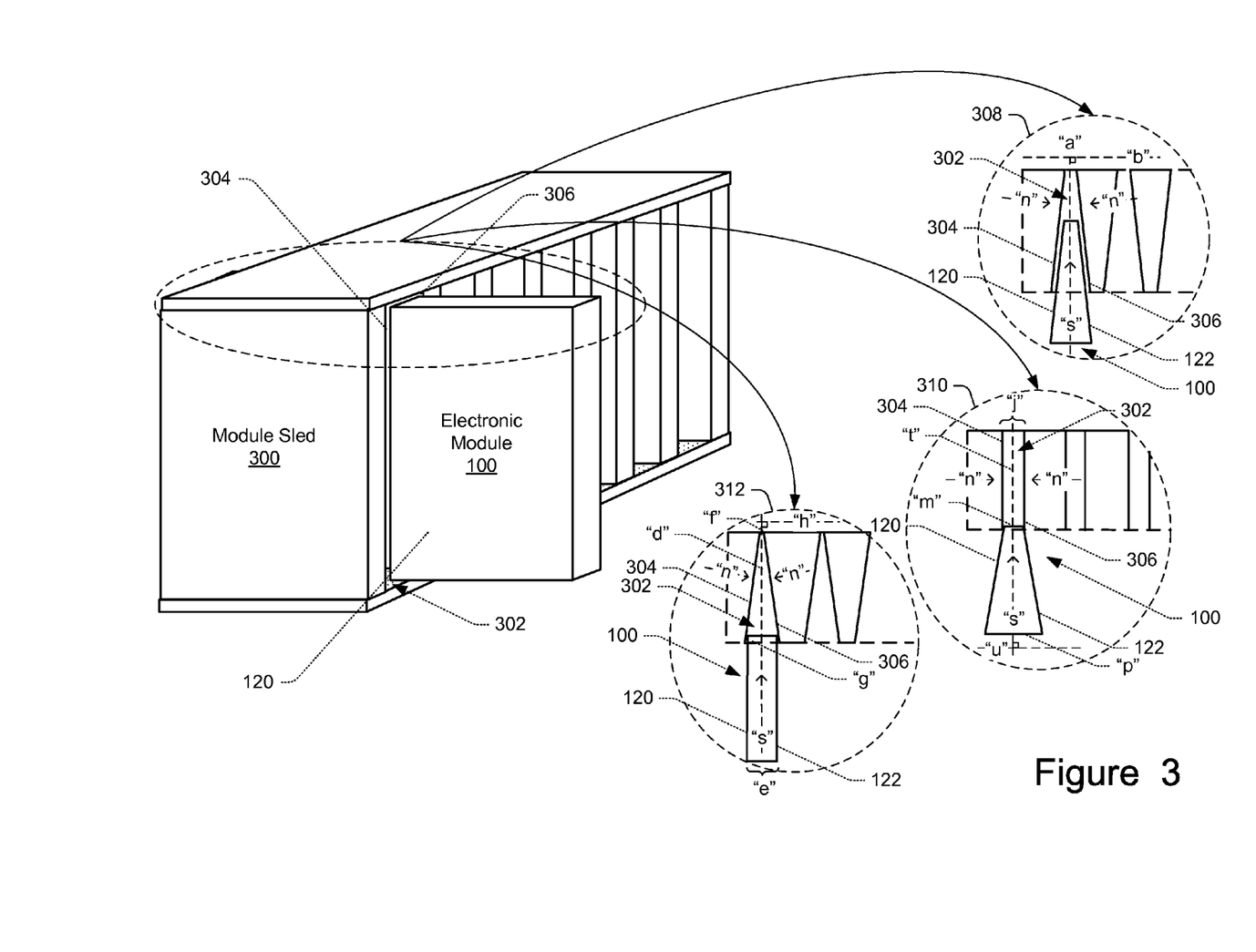
FIG. 3 shows the top views of a module sled that includes exemplary module bays for receiving electronic modules, in accordance with various embodiments of electronic module cooling.

FIG. 3 shows the top views of a module sled 300 that include exemplary module bays for receiving an electronic module, in accordance with various embodiments. The module sled 300 may include a plurality of bays, such as bay 302, whereby each of the bays may hold an electronic module, such as the electronic modules described in FIGS. 1-2. For example, the electronic module 100 may be inserted into bay 302 by sliding the electronic module 100 into bay 302. Likewise, the electronic module 100 may be removed from the bay 302 by sliding the module 100 out of the bay 302. In various embodiments, the electronic module, such as the electronic module 100, may include at least one handle (not shown) that facilitates the insertion and extraction of the electronic module from its corresponding bay. The module sled 300 may be manufactured from a metallic material. In at least one embodiment, the module sled 300 may be manufactured from aluminum nitride.

Each of bays in the module sled 300 may be formed by two side walls. For example, as shown, the bay 302 may be formed by side walls 304 and 306. The side walls of each bay 302 may serve to conduct heat away from electronic modules. For example, when the electronic module 100, is inserted, or substantially inserted, into the bay 302, the waste heat generated by the electronic module 100 may be conveyed away by conductance via the planar heat conduction sides 120 and 122 (FIG. 1) to the side walls 304 and 306.

Thermal contact conductance between an electronic module and the side walls of a bay of the module sled 300 may be optimized when there is a high normal force between the heat conduction sides of an electronic module (e.g., conduction sides 120 and 122) and the contact surfaces of the side walls (e.g., side walls 304 and 306). In other words, the planar heat conduction sides and the contact surfaces must be pressed tightly together for the most efficient thermal conductance. Nevertheless, the binding of the planar heat conduction sides and the contact surfaces of the side walls needs to accommodate the slidable insertion and removal of the electronic module from its corresponding bay.

Accordingly, in a top view 308 of at least one embodiment, the planar heat conduction sides of an electronic module may be retained in a corresponding bay via "wedge" action. For example, but not as a limitation, the planar heat conduction sides 120 and 122 of the electronic module 100 may form a "wedge", while the other opposing sides of the electronic module 100 remains parallel to each other. In essence, when viewed from the top, the electronic module 100 may be in the shape of an isosceles trapezoid. Moreover, the corresponding sidewalls 304 and 306 of the bay 302 may be sloped to conform to the non-parallel sides of the isosceles trapezoid. It will be appreciated that the "slopes" of the heat conduction sides 120 and 122 of the "wedge", as shown in top view 308, are greatly exaggerated for illustrative purposes. In the actual embodiment, the "slope" of each of the heat conduction sides 120 and 122 may be very gradual. For example, but not as a limitation, the slope may be in ratio of 100:1, where "100" is the "run" along a wedge axis "a", and "1" is the "rise" along an axis "b" that is normal to the wedge axis "a".

In this way, the planar heat conduction sides 120 and 122 of the electronic module 100 may be retained by the corresponding non-parallel side walls 304 and 306 of the bay 302 via wedging action. In various embodiments, the "wedge" formed by the planar heat conduction sides 120 and 122 of the electronic module 100 may produce high leverage with the corresponding non-parallel side walls of 304 and 306. In other words, the "wedge" may be designed so that high normal forces "n" on the planar heat conduction sides 120 and 122 may be generated by a small insertion force "s" along the wedge axis "a". For example, but not as a limitation, the leverage may be 100:1. In other words, one pound of insertion force "s" may generate 100 pounds of normal forces "n" on the planar heat conduction sides 120 and 122.

In at least one other exemplary embodiment, as shown in top view 310, the wedging action between the planar heat conduction sides 120 and 122 of the electronic module 100 and the side walls 304 and 306 of the bay 302 may be accomplished solely with the formation of a "wedge" by the planar heat conduction sides 120 and 122. In such an embodiment, the side walls 304 and 306 of the bay 302 may be parallel to each other, and spaced apart by a distance "j". Moreover, the "wedge" of the electronic module 100, as formed by the planar heat conduction sides 120 and 122, may include an end "m" that has a width that is equal to, or substantially equal to, the distance "j". Further, the "wedge" of the electronic module 100 may gradually and symmetrically increase in size along its wedge axis "t" to the its end "p", so that the width of the end "p" is larger than the width of the end "m".

In this way, as the electronic module 100 is inserted into the bay 302, the side walls 304 and 306 may exert normal forces "n", or leverage, on the "wedge" shape of the electronic module 100 to slidably lock the electronic module 100 in place. For example, but not as a limitation, the leverage may be 100:1. In other words, one pound of insertion force "s" may generate 100 pounds of normal forces "n" on the planar heat conduction sides 120 and 122. Once again, it will be appreciated that the "slopes" of the heat conduction sides 120 and 122 of the "wedge", as shown in top view 310, are greatly exaggerated for illustrative purposes. In the actual embodiment, the "slope" of each of the heat conduction sides 120 and 122 may be very gradual. For example, but not as a limitation, the slope may be in ratio of 100:1, where "100" is the "run" along the wedge axis "t", and "1" is the "rise" along an axis "u" that is normal to the wedge axis "u".

In further exemplary embodiments, as shown in top view 312, the wedging action between the planar heat conduction sides 120 and 122 of the electronic module 100 and the side walls 304 and 306 of the bay 302 may be accomplished solely with tapering of the side walls 304 and 306. In such embodiments, the planar heat conduction sides 120 and 122 of the electronic module 100 may be parallel to each other, and spaced apart by a distance "e". Moreover, the side walls 304 and 306 of the bay 302 may include an end "g" that has a width that is equal to, or substantially equal, to the distance "e". Further, the side walls 304 and 306 may gradually and symmetrically taper inward along the axis "d" until an end "f" of the bay 302, so that the width of end "f" is smaller than the width of the end "g".

In this way, as the electronic module 100 is inserted into the bay 302, the tapered side walls 304 and 306 may exert normal forces "n", or leverage, on the electronic module 100 to slidably lock the electronic module 100 in place. For example, but not as a limitation, the leverage may be 100:1. In other words, one pound of insertion force "s" may generate 100 pounds of normal forces "n" on the planar heat conduction sides 120 and 122. Once again, it will be appreciated that the tapering of the side walls 302 and 304 from the end "g" to the end "f", as shown in top view 312, are greatly exaggerated for illustrative purposes. In the actual embodiment, the taper slope of each of the side walls 302 and 304 may be very gradual. For example, but not as a limitation, the taper slope may be in ratio of 100:1, where "100" is the "run" along the axis "d", and "1" is the "rise" along an axis "h" that is normal to the axis "d".

In the exemplary embodiments described above, the surfaces of planar heat conduction sides 120 and 122, as well as the surfaces of the side walls 304 and 306, may be smooth and flat, with no asperities that hinder contact and heat transfer. In some embodiments, a compliant film with high thermal conductance may be inserted between the planar heat conduction sides 120 and 122, and the corresponding side walls 304 and 306 to further facilitate heat transfer. For example, but not as limitation, the compliant film may include a film of carbon filled elastomer. Further, it will be appreciated that in various embodiments, the bays of the module sled 300 may include one or more types of bays described in the top views 308-312.

Figure 4:
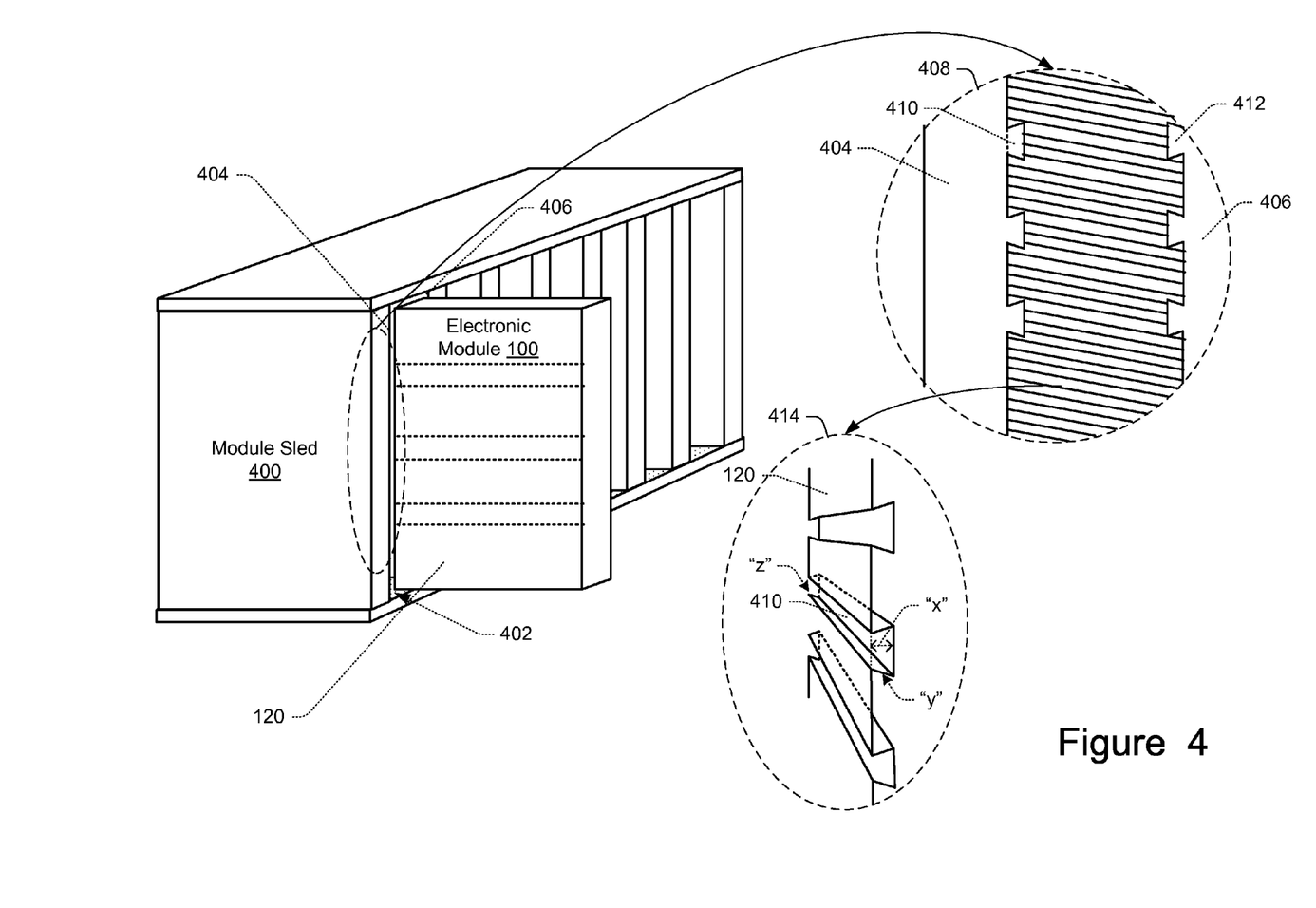
FIG. 4 shows a side view and a perspective view of exemplary sliding dovetail joints for securing an electronic module in an exemplary bay of a module sled, in accordance with various embodiments of electronic module cooling.

FIG. 4 shows a side view and a perspective view of exemplary sliding dovetail joints for securing an electronic module in an exemplary bay of a module sled 400, in accordance with various embodiments. The module sled 400 may include a plurality of bays, such as bay 402, whereby each of the bays may hold an electronic module, such as the electronic modules described in FIGS. 1-2. For example, the electronic module 100 may be inserted into bay 402 by sliding the module 100 into bay 402. Likewise, the electronic module 100 may be removed from the bay 402 by sliding the module 100 out of the bay 402. In various embodiments, the electronic module, such as the electronic module 100, may include at least one handle (not shown) that facilitates the insertion and extraction of the electronic module from its corresponding bay. The module sled 400 may be manufactured from a metallic material. In at least one embodiment, the module sled 400 may be manufactured from aluminum nitride.

Each of bays in them module sled 400 may be formed by two side walls. For example, as shown, the bay 402 may be formed by side walls 404 and 406. The side walls of each bay 402 may serve to conduct heat away from electronic modules. For example, when the electronic module 100, is inserted, or substantially inserted into the bay 402, the waste heat generated by the electronic module 100 may be conveyed away by conductance via the planar heat conduction sides 120 and 122 (FIG. 1) to the side walls 404 and 406.

Thermal contact conductance between an electronic module and the side walls of a bay of the module sled 400 may be optimized when there is a high normal force between the heat conduction sides of an electronic module (e.g., conduction sides 120 and 122) and the contact surfaces of the side walls (e.g., side walls 404 and 406). In other words, the planar heat conduction sides and the contact surfaces must be pressed tightly together for the most efficient thermal conductance. Nevertheless, at the same time, the binding of the planar heat conduction sides and the contact surfaces should accommodate the slidable insertion and removal of the electronic module from its corresponding bay.

In various embodiments, as shown in side view 408, the high normal force between the planar heat conduction sides 120 and 122 of the electronic module 100 and the side walls 404 and 406 may be achieved via the use of sliding dovetail joints. In at least one embodiment, each of the parallel side walls 404 and 406 may include dovetail pins 410. Moreover, each of the parallel planar heat conduction sides 120 and 122 may include corresponding dovetail sockets 412 that mate with the dovetail pins 410. Thus, when the electronic module 100 is inserted into the bay 402, the sliding dovetail joints may cause the side walls 404 and 406 of the bay 402 to bind tightly against the heat conduction sides 120 and 122, respectively, of the electronic module 100. Thus, waste heat from the electronic module 110 may be transferred to the module sled 400.

In further embodiments, one or more the dovetail sockets 410 of a conduction side, such as conduction side 120, may be tapered along the length of the socket. In at least one embodiment, as shown in perspective view 414, the depth "x" of the dovetail socket may gradually and smoothly increase from the front end "y" (i.e., module bay opening end) to the back-end "z" of the socket. Such increase, or taper, in the depth "x" of the dovetail socket may serve to pull the conduction side 120 tight against side wall of the bay 402 (e.g., side wall 404) that has mating dovetail pins.

By implementing dovetail joint tapering on both sides of an electronic module, such as electronic module 100, the one or more dovetail sockets 410 may pull the conduction sides of an electronic module into the side walls of a module bay, such as the module bay 402, when the electronic module 100 is fully inserted, or substantially inserted, into the bay 402. In this way, contact between the conduction sides of an electronic module and the side walls of a module bay may be maximized. It will be appreciated that the purpose of the dovetail joints, as described above, may differ significantly from dovetail joints typically used in woodworking applications. The purpose of woodworking dovetail joints is generally to maximize contact between the dovetail socket and pins of the joints, while leaving a degree of flexibility, i.e., gap, between the components that are joined by the woodworking dovetail joints.

In other exemplary embodiments, each of the side walls 404 and 406 of the bay 402 may be provided with dovetail sockets, while each of the planar heat conduction sides 120 and 122 of the electronic module 100 may be provided with corresponding dovetail pins. In still other embodiments, one of the side walls 404 and 406 may be provided with dovetail sockets, while the remaining side wall may be provided with corresponding dovetail pins. Likewise, one of the planar heat conduction sides 120 and 122 may be provided with dovetail pins, while the remaining side may be provided with corresponding dovetail sockets.

In some embodiments, a compliant film with high thermal conductance may be inserted between the various joining surfaces of the planar heat conduction sides 120 and 122, and the corresponding side walls 404 and 406 to further facilitate heat transfer. For example, but not as limitation, the compliant film may include a film of carbon filled elastomer. Further, it will be appreciated that in various embodiments, a module sled may include the one or more types bays described in FIG. 3, as well as the bay described in FIG. 4.

Figure 5:
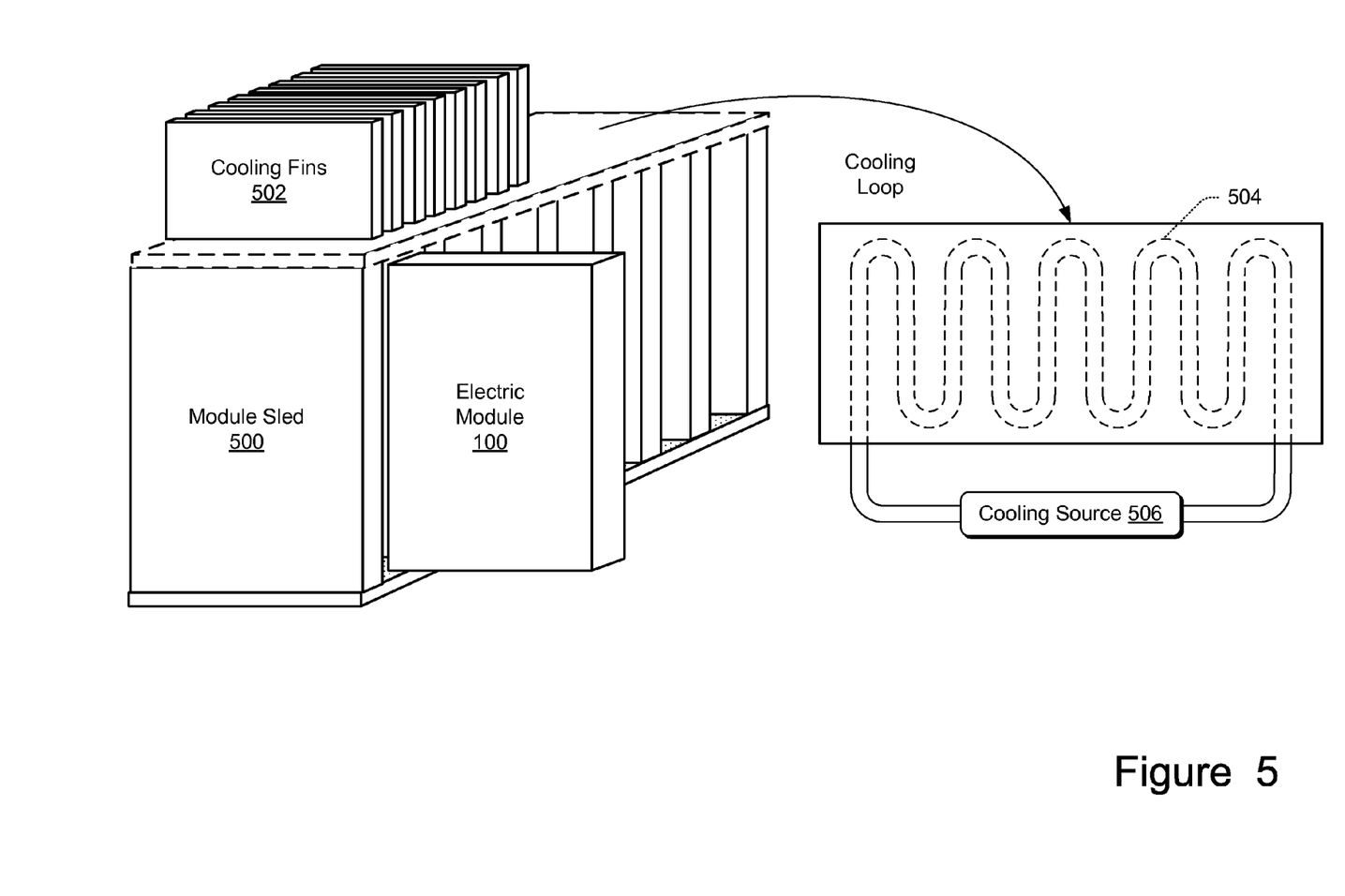
FIG. 5 shows an isometric view and a top view of an exemplary module sled that includes various cooling components, in accordance with various embodiments of electronic module cooling.

FIG. 5 shows an isometric view and a top view of an exemplary module sled 500 that includes various cooling components, in accordance with at least one embodiment. The module sled 500 may include the one or more types of bays described in FIG. 3, and/or the bay described in FIG. 4, that accommodate electronic modules. For example, but not as a limitation, the module sled 500 may accommodate electronic module 100.

The module sled 500 may be manufactured from a metallic material. In at least one embodiment, the module sled 500 may be manufactured from aluminum nitride. Thus, the module sled 500 may serve as a heat sink to dissipate the waste heat from one or more electronic modules, such as the electronic module 100, into an ambient air environment. In other embodiments, the module sled 500 may be provided with cooling fins 502 that increase the surface area of the module sled 500, and thus the effectiveness of the heat dissipation into the ambient air environment. It will be appreciated that the cooling fins 502 may be mounted on any surface of the module 500 as long as they do not interfere with the insertion and removal of the electronic modules.

In additional embodiments, a hollow cooling loop 504 may be embedded in a structural portion of the module sled 500, such as the top portion of the module sled 500. The cooling loop 504 may circulate a cooling fluid (e.g., water, ethanol, fluorocarbon, etc.) to transfer the waste heat from the one or more electronic modules to a cooling source 506. In some embodiments, the cooling source 506 may be a radiator, a heat pipe, a cooling water source. The cooling 506 may further include a compressor, a pump, and/or a fan that facilitate the circulation of the coolant in the cooling loop 504. It will be appreciated that, while the cooling loop 504 is illustrated as being embedded in a top portion of the module sled 500, any structural portion of the module sled 500 may be provided with cooling loops.

Figure 6:
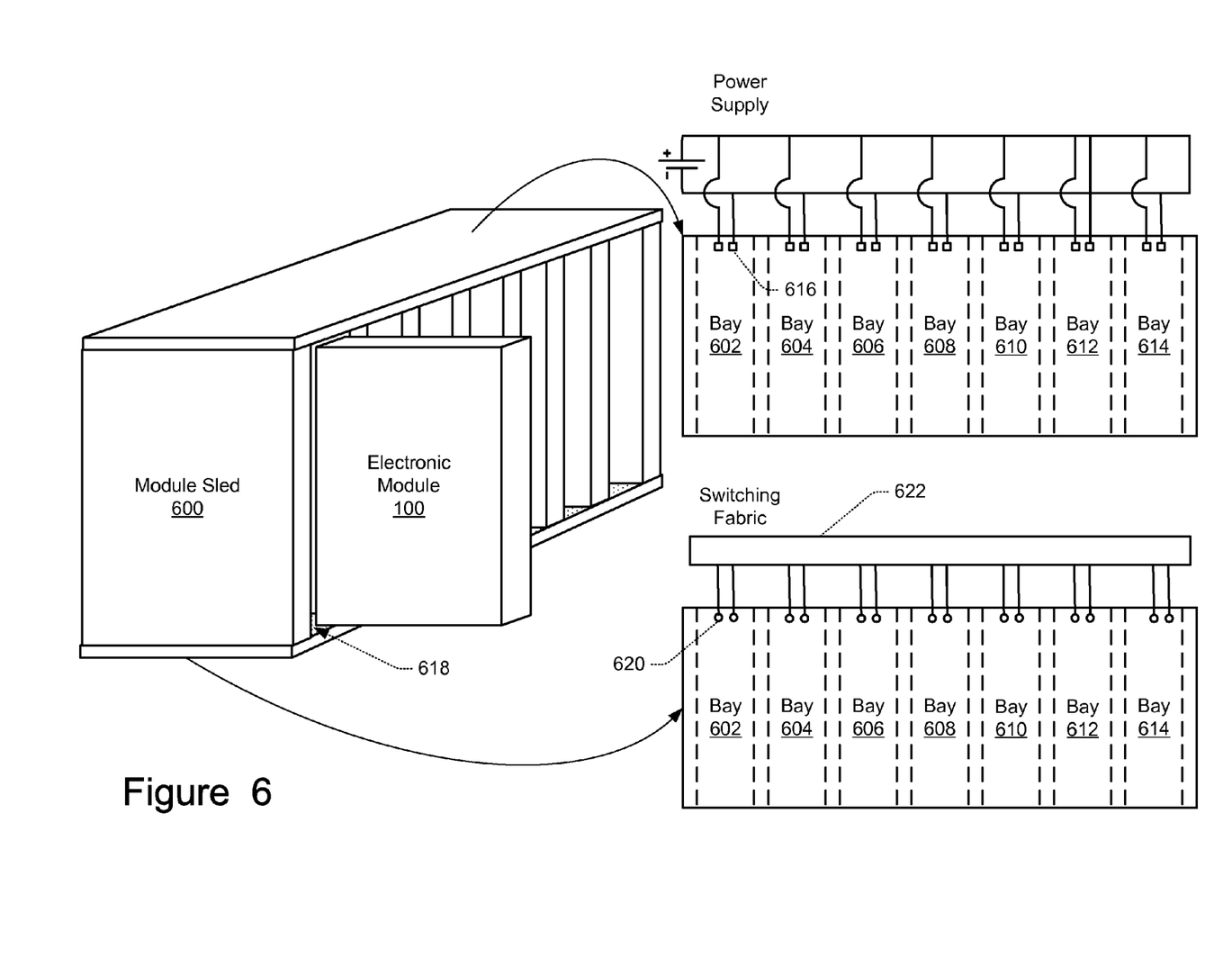
FIG. 6 shows an isometric view and a top view of an exemplary module sled that includes power and data connections, in accordance with various embodiments of electronic module cooling.

FIG. 6 shows an isometric view of an exemplary module sled 600 that includes power and data connections, in accordance with various embodiments. The module sled 600 may include the one or more types of bays described in FIG. 3, and/or the bay described in FIG. 4, that accommodate electronic modules. For example, but not as a limitation, the module sled 600 may accommodate electronic module 100. As shown, each of the bays 602-614 may be provided with power connector 616 that provides power to the electronic modules that are inserted into each of the bays from a power supply. In various embodiments, the power source may provide direct current (DC) or alternating current (AC). The power connector 616 may couple with the power connectors that are present on the electronic modules. For example, but not as a limitation, the spring-loaded power connector 116 of the electronic module 100 may engage the power connector 616 when the electronic module 100 is inserted into the bay 618.

Each of the bays 602-614 may also be provided with data connector 620 that enable each of the bays 602-614 to communicate via a common switching fabric 622. In various embodiments, the data connectors 620 may enable a plurality of electronic modules to communicate with each other when each module is fully inserted into a corresponding bay of the module sled 600. For example, but not as a limitation, the data connectors 620 may be optical connectors that engage with the optical connectors of the electronic modules, such as the electronic module 100. In another example, the data connectors 620 may be electrical connectors. In further embodiments, a power connector 616 may be combined with a data connector 620 so that a single connector provides both power and data communication.

It will be appreciated that while the power connectors 616 are illustrated as being embedded in the top portion of module sled 600, the power connectors 616 may be positioned in any structural portion of the module sled 600 provided that power connectors 616 supply power to each of the bays 602-614, and do not interfere with waste heat transfer from the planar heat conduction sides of each electronic module (e.g., electronic module 100) to the side walls of the corresponding bay of the module sled 600.

Likewise, the data connectors 620 may be positioned in any structural portion of the module sled 600 provided that the data connectors enable communication between a plurality of electronic modules that are inserted into their corresponding bays, and do not interfere with waste heat transfer from the planar heat conduction sides of each electronic module (e.g., electronic module 100) to the side walls of the corresponding bay of the module sled 600.

Exemplary Processes

Figure 7:
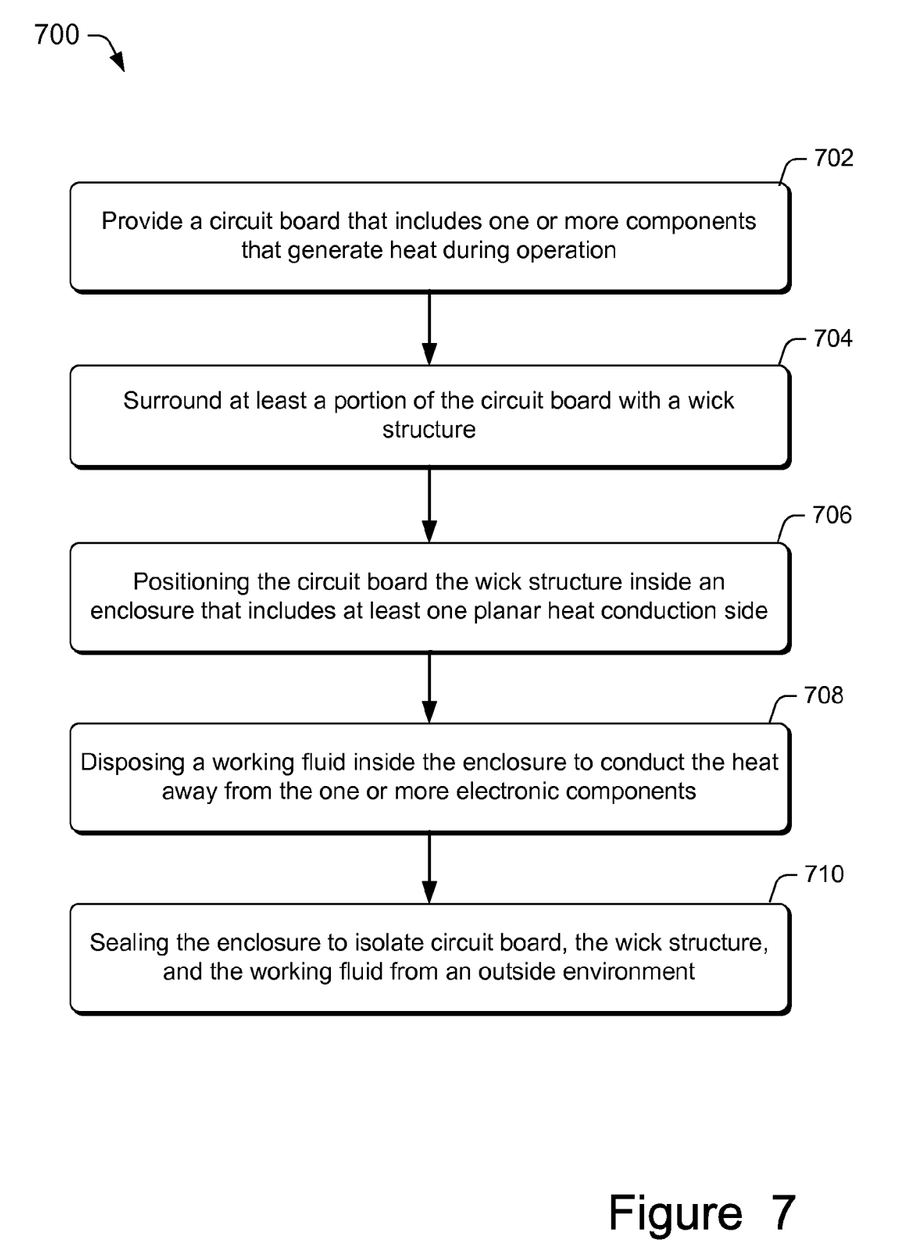
FIG. 7 shows a flow diagram illustrating an exemplary process for forming an electronic module, in accordance with various embodiments of electronic module cooling.

FIG. 7 shows a flow diagram illustrating an exemplary process 700 for forming an electronic module, in accordance with various embodiments. The order in which the operations are described in the process 700 is not intended to be construed as a limitation, and any number of the described blocks can be combined in any order and/or in parallel to implement the process.

At block 702, a circuit board that includes one or more electronic components that generate heat may be provided. The circuit board may be one of the circuit boards illustrated in FIGS. 1-2. In various embodiments, the circuit board may be a "low-profile" circuit board and/or manufactured using chip-on-board technology.

At block 704, at least a portion of the circuit board may be surrounded with a wick structure. In various embodiments, the wick structure may be a foam wick material that provides the ability to move a working fluid via capillary action. The wick structure may include one or more slots or indentations to accommodate one or more corresponding electronic components on the circuit board.

At block 706, the circuit board and the wick structure may be placed inside an enclosure that includes at least one planar heat conduction side. In some embodiments, the enclosure may include two metallic portions (e.g., aluminum nitride portions) that are joined and sealed. In other embodiments, the enclosure may include an extruded polymer body portion that is joined and sealed with two metallic end portions (e.g., aluminum nitride portions). The enclosure may include integral power and data connectors for providing power and data communication capabilities to the one or more electronic components of the enclosed circuit board.

At block 708, a working fluid may be disposed inside the enclosure to provide the heat transfer action from the one or more electronic components of the circuit board to the at least one planar heat conduction side of the enclosure. In various embodiments, the working fluid may be ethanol, fluorocarbon, or other types of dielectric fluid.

At block 710, the enclosure may be sealed to isolate the circuit board, the wick structure, and the working fluid from an outside environment. In various embodiments, the enclosure may be at least partially evacuated so that the working fluid may vaporize at a pre-designated temperature to effectively convey the waste heat away from the one or more electronic components and to the at least planar heat conduction side of the enclosure.

Figure 8:
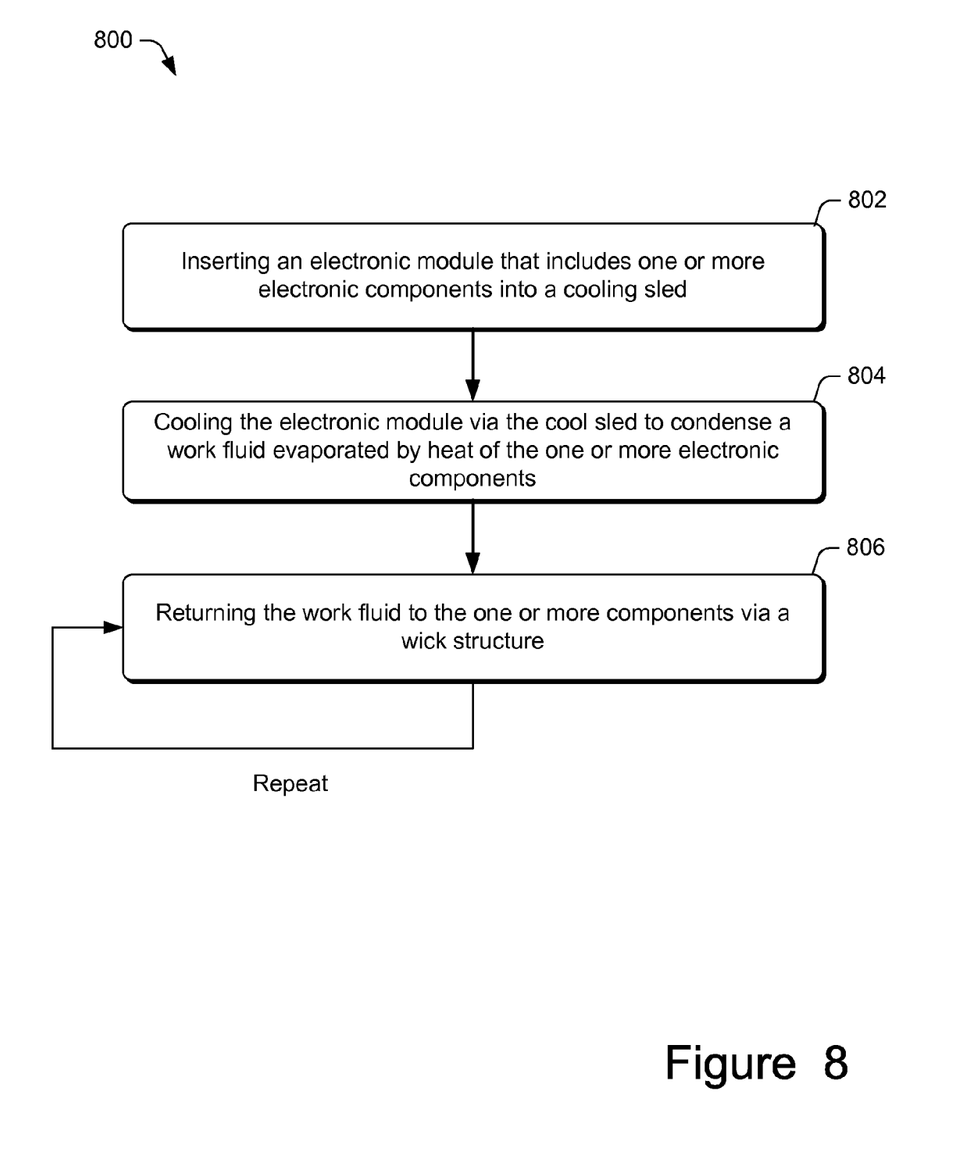
FIG. 8 shows a flow diagram illustrating an exemplary process for cooling an electronic module, in accordance with various embodiments of electronic module cooling.

FIG. 8 shows a flow diagram illustrating an exemplary process for cooling an electronic module, in accordance with various embodiments. The order in which the operations are described in the process 800 is not intended to be construed as a limitation, and any number of the described blocks can be combined in any order and/or in parallel to implement the process.

At block 802, an electronic module that includes one or more electronic components may be inserted into a module sled. The electronic module may be one of the modules described in FIGS. 1 and 2, and the module sled include features from one or more module sleds described in FIGS. 3-6. In at least one embodiment, the insertion of the electronic module into the module sled may cause the power and data connectors on the electronic module to align with the corresponding power and data connectors on the module sled. Thus, the inserted electronic module may be supplied with power for performing operations, and/or communicate with other external electronic components/electronic modules. The waste heat generated by the one or more electronic components may cause the working fluid to vaporize, thereby transferring heat to one or more planar heat conduction sides of the electronic module.

At block 804, the inserted electronic module may be cooled via the module sled. The cooling of the inserted electronic module may cause the working fluid inside the module to condense into liquid form. In various embodiments, the module sled may be further cooled by a cooling source. The cooling source may include at least one of a radiator, a heat pipe, a cooling water source, cooling fins, and/or the like.

At block 806, the condensed working fluid may be transferred by a wick structure inside the electronic module back to the one or more electronic components via capillary action. Subsequently, once the working fluid returns to the one or more electronic component, the process 800 may loop back to block 804 so that the vaporized working fluid may be further heated and cooled. The loop of the process 804 may repeat until there is no longer sufficient waste heat to vaporize the working fluid.

The cooling of electronic modules described herein may ensure their optimal performance. Additionally, the cooling of the electronic modules in accordance with various embodiments may enable the electronic module to be packed tightly together to achieve greater computing density. Moreover, the sealed nature of the electronic modules means they are easily pluggable. In other words, the modules may be conveniently swapped to facilitate repair or upgrade.

CONCLUSION

In closing, although the various embodiments have been described in language specific to structural features and/or methodological acts, it is to be understood that the subject matter defined in the appended representations is not necessarily limited to the specific features or acts described. Rather, the specific features and acts are disclosed as exemplary forms of implementing the claimed subject matter.

The invention claimed is:

1. An electronic module, comprising:
   a circuit board that includes one or more electronic components to generate heat during operation;
   a working fluid to conduct the heat away from the one or more electronic components via vaporization;
   a wick structure that at least partially surrounds the circuit board, the wick structure to conduct the working fluid back to the one or more electronic component via capillary action; and
   a sealed enclosure to encapsulate the circuit board, the working fluid, and the wick structure, the sealed enclosure including at least one planar heat conduction side to contact a corresponding planar surface of a heat sink.

2. The electronic module of claim 1, where in the sealed enclosure is to form a partial vacuum.

3. The electronic module of claim 1, wherein the sealed enclosure further includes an integral power connector to provide power to the one or more electronic components from an external power source.

4. The electronic module of claim 1, wherein the sealed enclosure further includes an integral data connector to enable the one or more electronic components to communicate with at least one additional electronic component that is outside of the sealed enclosure.

5. The electronic module of claim 4, wherein the integral data connector includes a fiber optic connector.

6. The electronic module of claim 1, wherein the at least one planar heat conduction side of the sealed enclosure comprises aluminum nitride.

7. The electronic module of claim 1, wherein the sealed enclosure includes two planar heat conduction sides that form a wedge, the wedge to be removably retained by two corresponding planar surfaces of the heat sink via a wedging force.

8. The electronic module of claim 1, wherein the sealed enclosure includes two parallel planar heat conduction sides, the sealed enclosure to be removably retained by two corresponding non-parallel planar surfaces of the heat sink via a wedging force.

9. The electronic module of claim 1, wherein the at least one planar heat conduction side include a dovetail socket or a dovetail pin, the dovetail socket to slidably fit into a mating dovetail pin on a corresponding planar surface the heat sink, and the dovetail pin to slidably fit into a mating dovetail socket on the corresponding planar surface.

10. The electronic module of claim 9, wherein the dovetail socket is tapered to maximize surface contact between the at least one planar heat conduction side and the corresponding planar surface of the heat sink when the dovetail pin is inserted into the dovetail.

11. The electronic module of claim 1, wherein at least a portion of the sealed enclosure includes a polymer portion that is formed via extrusion.

12. A method of forming an electronic module, comprising:
   surrounding at least a portion of a circuit board that includes one or more electronic components with a wick structure;
   positioning the circuit board and the wick structure inside an enclosure that includes at least one planar heat conduction side;
   disposing a working fluid inside the enclosure, the working fluid to conduct heat away from the one or more electronic components via vaporization and circulate back to the one or more electronic component via capillary action through the wick structure; and
   sealing the enclosure to isolate the circuit board, the wick structure, and the working fluid from an outside environment.

13. The method of claim 11, further comprising providing the enclosure with an integral power connector, and the positioning the circuit board includes positioning the circuit board inside the enclosure such that the one or more electronic components receive power from an external power source via the integral power connector.

14. The method of claim 11, further comprising providing the enclosure with an integral data connector, and the positioning of the circuit board includes positioning the circuit board such that the one or more electronic components communicates with at least one additional external electronic component via the integral data connector.

15. The method of claim 11, further comprising providing the at least one planar heat conduction side with a dovetail socket or a dovetail pin, the dovetail socket to slidably fit into a mating dovetail pin on a corresponding planar surface of a heat sink, and the dovetail pin to slidably fit into a mating dovetail socket on the corresponding planar surface.

16. A method of cooling an electronic module, comprising:
   inserting an electronic module into a cooling sled, the cooling sled including at least one bay having a pair of sides to retain the electronic module;
   cooling the electronic module via the cooling sled to condense a working fluid that is vaporized by heat generated by the one or more electronic components sealed in the electronic module; and
   returning the working fluid to the one or more electronic components via a wick structure that is sealed in the electronic module.

17. The method of claim 16, further comprising providing power and data communication to the one or more electronic components sealed inside the electronic module.

18. The method of claim 16, wherein the at least one bay includes two planar surfaces, and wherein the inserting includes inserting an electronic module having two planar heat conduction sides that form a wedge into the at least one bay so that the electronic module is removably retained in the at least one bay by the two planar surfaces via a wedging force.

19. The method of claim 16, wherein the at least one bay includes a dovetail socket or a dovetail pin, and the electronic module includes a mating dovetail pin or a dovetail socket, and wherein the inserting includes inserting electronic module so that the dovetail pin slidably fits into the mating dovetail socket.

20. The method of claim 19, wherein the dovetail socket is tapered to maximize surface contact between the at least one planar heat conduction side and a corresponding planar surface of the at least one bay when the dovetail pin is inserted into the dovetail.

* * * * *